United States Patent
Onoda et al.

(10) Patent No.: US 10,002,837 B2
(45) Date of Patent: Jun. 19, 2018

(54) SEMICONDUCTOR DEVICE

(71) Applicant: DENSO CORPORATION, Kariya, Aichi-pref. (JP)

(72) Inventors: Kenji Onoda, Kariya (JP); Syoichirou Oomae, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/547,583

(22) PCT Filed: Apr. 15, 2016

(86) PCT No.: PCT/JP2016/002043
§ 371 (c)(1),
(2) Date: Jul. 31, 2017

(87) PCT Pub. No.: WO2016/185666
PCT Pub. Date: Nov. 24, 2016

(65) Prior Publication Data
US 2018/0012847 A1  Jan. 11, 2018

(30) Foreign Application Priority Data
May 18, 2015 (JP) .................................. 2015-100822

(51) Int. Cl.
*H01L 29/49* (2006.01)
*H01L 23/00* (2006.01)
(Continued)

(52) U.S. Cl.
CPC ........ *H01L 23/562* (2013.01); *H01L 21/4825* (2013.01); *H01L 21/4842* (2013.01);
(Continued)

(58) Field of Classification Search
CPC ............... H01L 23/562; H01L 23/3114; H01L 23/49513; H01L 23/49548
See application file for complete search history.

(56) References Cited

U.S. PATENT DOCUMENTS

2005/0167802 A1    8/2005  Hirano et al.
2007/0018335 A1*   1/2007  Cho .................. H01L 23/13
                                                    257/778
(Continued)

FOREIGN PATENT DOCUMENTS

JP      06-268120 A    9/1994
JP      11-150203 A    6/1999
(Continued)

*Primary Examiner* — Michael Shingleton
(74) *Attorney, Agent, or Firm* — Posz Law Group, PLC

(57)          ABSTRACT

A semiconductor device includes a metal member, a first semiconductor chip, a second semiconductor chip, a first solder and a second solder. A quantity of heat generated in the first semiconductor chip is greater than the second semiconductor chip. The second semiconductor chip is formed of a material having larger Young's modulus than the first semiconductor chip. The first semiconductor chip has a first metal layer connected to the metal member through a first solder at a surface facing the metal member. The second semiconductor chip has a second metal layer connected to the metal member through a second solder at a surface facing the metal member. A thickness of the second solder is greater than a maximum thickness of the first solder at least at a portion of the second solder corresponding to a part of an outer peripheral edge of the second metal layer.

17 Claims, 9 Drawing Sheets

(51) Int. Cl.
*H01L 23/495* (2006.01)
*H01L 23/31* (2006.01)
*H01L 21/48* (2006.01)
*H01L 21/56* (2006.01)
*H02P 27/06* (2006.01)

(52) U.S. Cl.
CPC ........ *H01L 21/4871* (2013.01); *H01L 21/565* (2013.01); *H01L 23/3114* (2013.01); *H01L 23/4952* (2013.01); *H01L 23/49513* (2013.01); *H01L 23/49548* (2013.01); *H01L 23/49562* (2013.01); *H01L 23/49568* (2013.01); *H01L 23/49575* (2013.01); *H01L 24/33* (2013.01); *H01L 24/83* (2013.01); *H01L 2224/3303* (2013.01); *H01L 2224/83815* (2013.01); *H01L 2924/10253* (2013.01); *H01L 2924/10272* (2013.01); *H01L 2924/13055* (2013.01); *H01L 2924/13091* (2013.01); *H01L 2924/14252* (2013.01); *H01L 2924/351* (2013.01); *H02P 27/06* (2013.01)

(56) References Cited

U.S. PATENT DOCUMENTS

2016/0086893 A1* 3/2016 Wu ................. H01L 23/562
                                                      257/669
2017/0271275 A1* 9/2017 Inaba ............... H01L 23/3107
2017/0338189 A1* 11/2017 Soda ............... H01L 23/562

FOREIGN PATENT DOCUMENTS

JP      2013-089763 A     5/2013
JP      2013-140870 A     7/2013

* cited by examiner

SEMICONDUCTOR DEVICE

CROSS REFERENCE TO RELATED APPLICATIONS

This application is the U.S. national phase of International Patent Application No. PCT/JP2016/002043 filed on Apr. 15, 2016 and is based on Japanese Patent Application No. 2015-100822 filed on May 18, 2015, the disclosure of which is incorporated herein by reference.

TECHNICAL FIELD

The present disclosure relates to a semiconductor device in which a first semiconductor chip and a second semiconductor chip formed of materials having different Young's modulus are arranged at the same surface of a metal member and are connected to the metal member through solders.

BACKGROUND ART

For example, a patent literature 1 discloses a semiconductor device in which a first semiconductor chip and a second semiconductor chip formed of materials having different Young's modulus are arranged at the same surface of a metal member and are connected to the metal member through solders.

In the semiconductor device, a conductive pattern (hereinafter, referred to as a metal member) is arranged on one surface of an insulating substrate, and a chip formed of Si (hereinafter, referred to as a first semiconductor chip) and a chip formed of SiC (hereinafter, referred to as a second semiconductor chip) are arranged on the same surface of the metal member. A first metal layer of the first semiconductor chip is connected to the metal member through a first solder and a second metal layer of the second semiconductor chip is connected to the metal member through a second solder. A thickness of the first solder and a thickness of the second solder are the same with each other.

PRIOR ART LITERATURE

Patent Literature

Patent literature 1: JP 2013-89763 A

SUMMARY OF INVENTION

As described above, the first semiconductor chip is formed of Si and the second semiconductor chip is formed of SiC. Since SiC has greater Young's modulus than Si, the second semiconductor chip is less likely to deform than the first semiconductor chip, that is, the second semiconductor chip is harder than the first semiconductor chip. Therefore, a thermal stress applied to the second solder due to, for example, temperature variation of usage environment is greater than a thermal stress applied to the first solder.

In the above semiconductor device, when a quantity of heat generated in the first semiconductor chip is greater than the second semiconductor chip, the thickness of the first solder is reduced and the thickness of the second solder is fitted to the thickness of the first solder. However, since the thermal stress applied to the second solder is greater than the thermal stress applied to the first solder, reliability of connection of the second solder is decreased.

It is an object of the present disclosure to provide a semiconductor device capable of increasing reliability of connection of a second semiconductor chip while securing heat radiation performance of a first semiconductor chip.

According to an aspect of the present disclosure, a semiconductor device includes a metal member, a first semiconductor chip, a second semiconductor chip, a first solder and a second solder. The first semiconductor chip is disposed on a surface of the metal member and has a first metal layer at a surface facing the metal member. The second semiconductor chip is formed of a material having larger Young's modulus than the first semiconductor chip. The second semiconductor chip is disposed at a position different from the first semiconductor chip on the surface of the metal member and has a second metal layer at a surface facing the metal member. The first solder is disposed between the metal member and the first metal layer of the first semiconductor chip and connects the metal member and the first metal layer. The second solder is disposed between the metal member and the second metal layer of the second semiconductor chip and connects the metal layer and the second metal layer. A quantity of heat generated in the first semiconductor chip is greater than a quantity of heat generated in the second semiconductor chip. A thickness of the second solder is greater than a maximum thickness of the first solder at least at a portion of the second solder corresponding to a part of an outer peripheral edge of the second metal layer.

In the first solder and the second solder, the thermal stresses are concentrated to the portions corresponding to the outer peripheral edge of the first metal layer and the second metal layer. Since the second semiconductor chip is formed of the material having larger Young's modulus than the first semiconductor chip, the thermal stress concentrated to the second solder is greater than the thermal stress concentrated to the first solder. According to the aspect of the present disclosure, the thickness of the second solder is greater than the maximum thickness of the first solder at least at the portion of the second solder corresponding to the part of the outer peripheral edge of the second metal layer. The reliability of the connection of the second solder is increased compared to a structure in which the second solder is thickened.

The first solder and the second solder are not uniformly thickened, but the second solder is thickened than the first solder. As a result, heat radiation performance of the first semiconductor chip, which generates large quantity of heat, is secured while increasing the reliability of the connection of the second solder.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Embodiments of the present disclosure will be described with reference to the drawings. In the following embodiments, elements that are common or relative with each other are designated by the same symbols. A thickness direction of a heat sink, which corresponds to a metal member, is referred to as Z direction. A direction orthogonal to the Z direction and in which a semiconductor chip providing an upper arm and a semiconductor chip providing a lower arm are arranged is referred to as X direction. A direction orthogonal to the Z direction and the X direction is referred to as Y direction. XY plane defined by the X direction and the Y direction is orthogonal to the Z direction. Unless otherwise noted, a shape along the XY plane is referred to as a planar shape.

First Embodiment

An example of an electrical power conversion device in which a semiconductor device is employed will be described with reference to FIG. 1.

Figure 1:
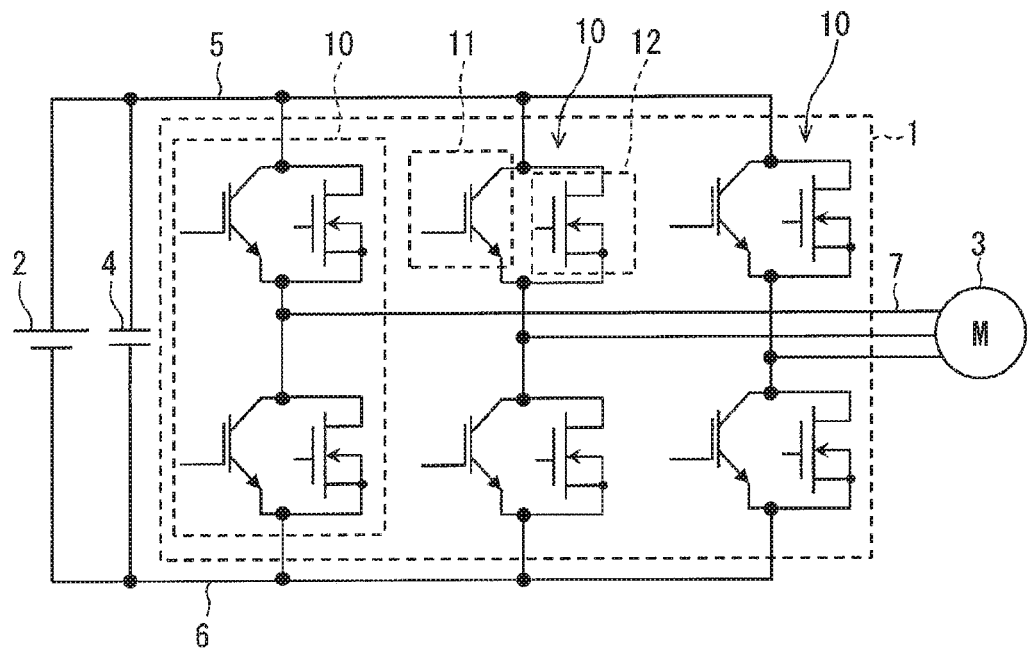
FIG. 1 is a diagram illustrating a schematic structure of an electrical power conversion device in which a semiconductor device according to a first embodiment is employed.

An electrical power conversion device 1 shown in FIG. 1 converts a direct current (DC) voltage supplied from a DC power source 2 into a three-phase alternating current (AC), and outputs the three-phase AC to a motor 3 that is a three-phase AC motor. The electrical power conversion device 1 is mounted to, for example, an electrical vehicle or a hybrid vehicle. The electrical power conversion device 1 may convert an electrical power generated by the motor 3 into a DC power and may charge the DC power source 2 (e.g., a battery). Therefore, the motor 3 may be referred to as a motor generator. An element designated by a symbol 4 in FIG. 1 is a smooth capacitor 4.

The electrical power conversion device 1 has a three-phase inverter. The three-phase inverter includes three phases of upper and lower arms disposed between a high-potential power line 5 and a low-potential power line 6. The high-potential power line 5 is connected to a positive electrode (i.e., a high-potential side) of the DC power source 2. The low-potential power line 6 is connected to a negative electrode (i.e., a low-potential side) of the DC power source. The upper arm and the lower arm of each phase are provided by a semiconductor device 10. Namely, in the present embodiment, the semiconductor device 10 provides one phase of the upper arm and the lower arm.

The semiconductor device 10 includes two Insulated Gate Bipolar Transistors (IGBT) 11 and two Metal-Oxide-Semiconductor Field-Effect Transistors (MOSFET) 12. The two IGBTs 11 are connected in series with each other between the high-potential power line 5 and the low-potential power line 6. The MOSFETs 12 are respectively connected in parallel with the IGBTs 11. A back-flow Free Wheeling Diode (FWD), which is not illustrated, is connected in reverse-parallel with the IGBT 11 and the FWD flows back the current. The MOSFET 12 has a parasitic diode, which is not illustrated, and the parasitic diode flows back the current.

In the present embodiment, the IGBT 11 is an n-channel type IGBT and the MOSFET 12 is an n-channel type MOSFET. A cathode electrode of the FWD is commonly used with a collector electrode of the IGBT 11. An anode electrode of the FWD is commonly used with an emitter electrode of the IGBT 11. A cathode electrode of the parasitic diode is commonly used with a drain electrode of the MOSFET 12. An anode electrode of the parasitic diode is commonly used with a source electrode of the MOSFET 12.

In the semiconductor device 10, the IGBT 11 of the upper arm (i.e., a high-side) has a collector electrode electrically connected to the high-potential power line 5 and an emitter electrode connected to an output line 7 leading to the motor 3. Conversely, the IGBT 11 of the lower arm (i.e., a low-side) has a collector electrode connected to the output line 7 leading and an emitter electrode electrically connected to the low-potential power line 6. The MOSFET 12 of the upper arm has a drain electrode electrically connected to the collector electrode of the IGBT 11 of the upper arm, that is, the high-potential power line 5. The MOSFET 12 of the upper arm has a source electrode connected to the emitter electrode of the IGBT 11 of the upper arm, that is, the output line 7. Conversely, the MOSFET 12 of the lower arm has a drain electrode electrically connected to the collector electrode of the IGBT 11 of the lower arm and the output line 7. The MOSFET 12 of the lower arm has a source electrode electrically connected to the emitter electrode of the IGBT 11 of the lower arm, that is, the low-potential power line 6.

The electrical power conversion device 100 may include a boost converter that boosts the DC voltage supplied from the DC power source 2, a driving circuit that outputs a driving signal to switching elements providing the IGBT 11, the MOSFET 12 and the boost converter of the three-phase inverter, and a control unit that outputs a control signal to the driving circuit, in addition to the above described three-phase inverter.

As described above, a structure in which the IGBT 11 and the MOSFET 12 are connected in parallel with each other is well-known. When the IGBT 11 and the MOSFET 12 are turned on, saturated voltage of the MOSFET 12 is smaller than IGBT 11 in a small current region and saturated voltage of the IGBT 11 is smaller than MOSFET 12 in a large current region. For example, turn-on loss is decreased by controlling the on and off of the IGBT 11 and the MOSFET 12 so that the current is flown in the MOSFET 12 in the small current region and the current is flown in the IGBT 11 in the large current region. Since the turn-off loss only depends on the turn-off loss of the MOSFET 12, which has excellent switching performance, a tail current is decreased and the turn-off loss is decreased.

Figure 2:
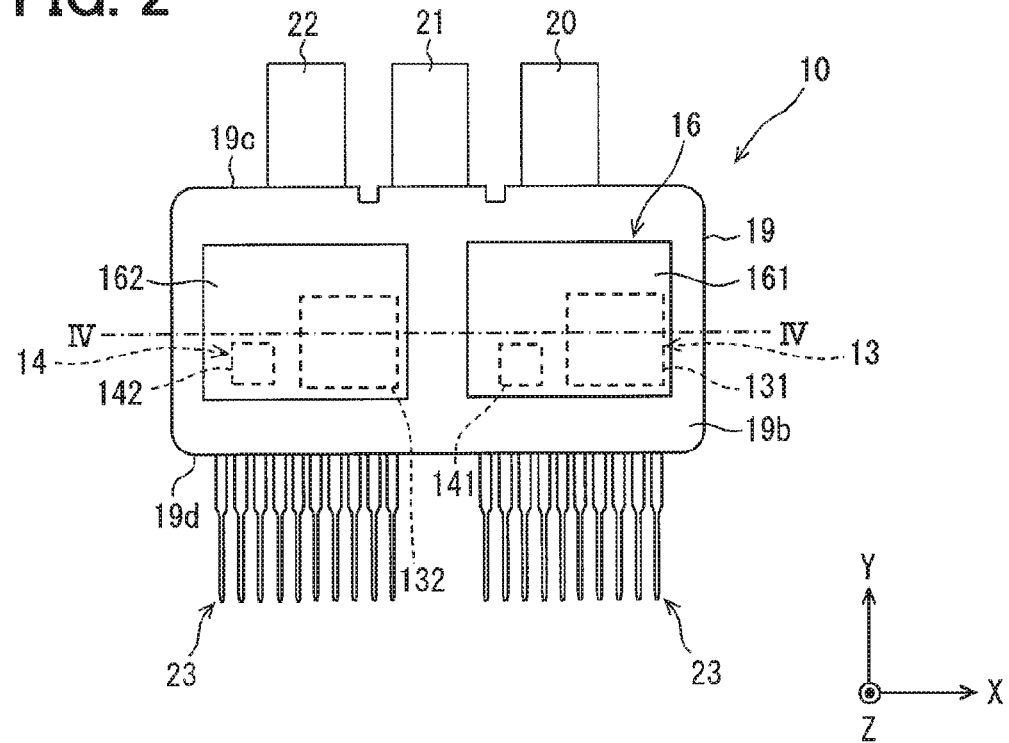
FIG. 2 is a plan view illustrating a schematic structure of the semiconductor device according to the first embodiment.
Figure 3:
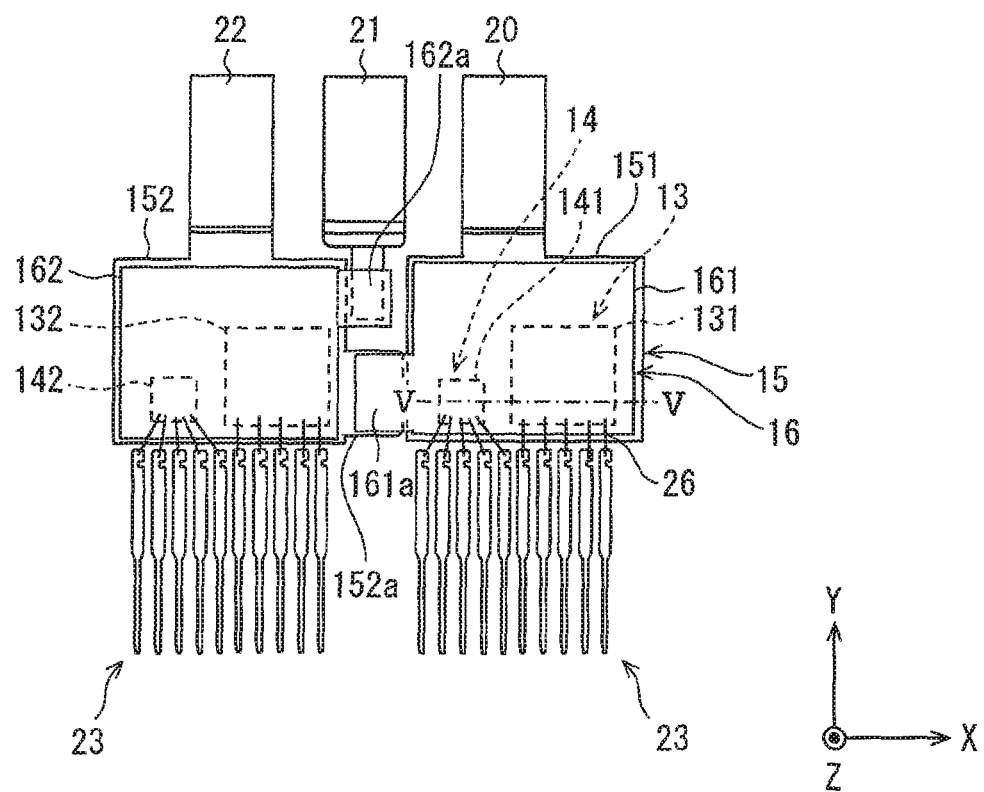
FIG. 3 is a plan view of the semiconductor device according to the first embodiment in which an illustration of a sealing resin is omitted.
Figure 4:
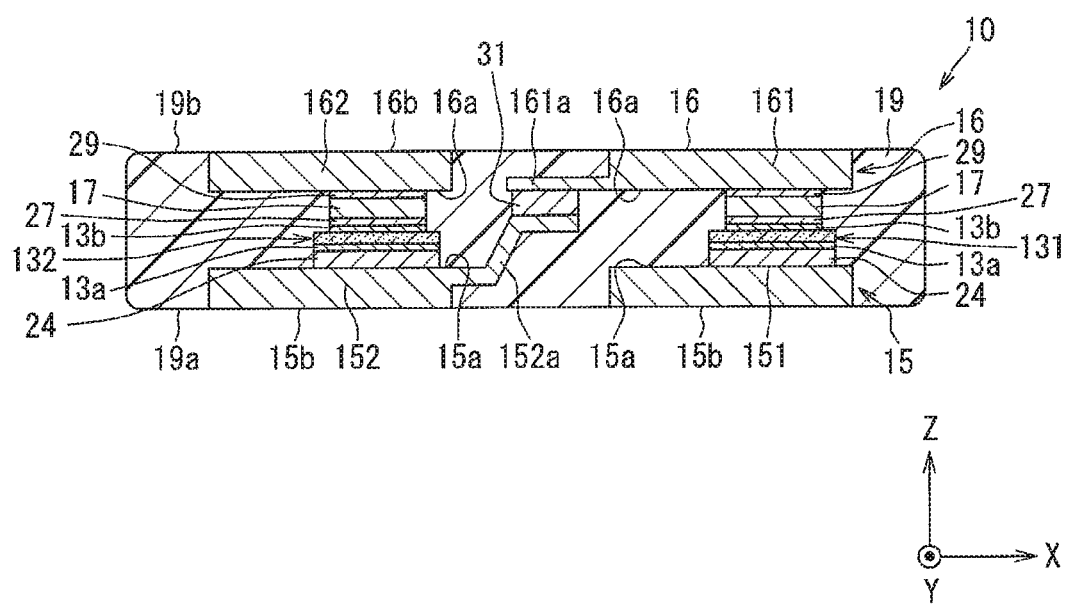
FIG. 4 is a cross-sectional view taken along a line IV-IV of FIG. 2.
Figure 5:
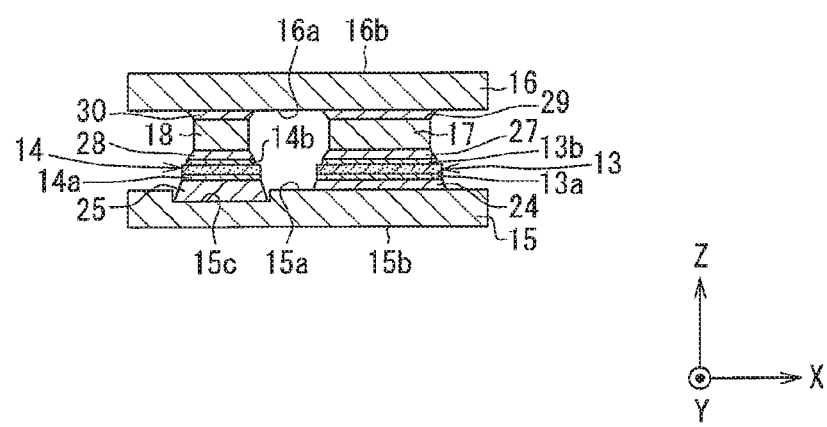
FIG. 5 is a cross-sectional view taken along a line V-V of FIG. 3.

Next, a schematic structure of the semiconductor device 10 will be described with reference to FIG. 2 to FIG. 5. FIG. 3 is a diagram in which an illustration of a sealing resin is omitted in FIG. 2. FIG. 5 is a cross-sectional view taken along a line V-V of FIG. 3 and the illustration of the sealing resin is omitted in FIG. 5. Exactly, FIG. 5 is a diagram illustrating a connection structure of a first semiconductor chip 131 and a second semiconductor chip 141 of an upper arm. However, since the connection structure is similar in a lower arm, the connection structure of the first semiconductor chip 13 and the second semiconductor chip 14 is shown in FIG. 5.

As shown in FIG. 2 to FIG. 5, a semiconductor device 10 includes the first semiconductor chip 13, the second semiconductor chip 14, heat sinks 15 and 16, terminals 17 and 18, and a sealing resin 19. Additionally, the semiconductor device 10 of the present embodiment includes a high-potential power source terminal 20, a low-potential power source terminal 21, an output terminal 22 and a signal terminal 23, as terminals for external connection. Hereinafter, the high-potential power source terminal 20 will be also referred to as a P terminal 20. Similarly, the low-potential power source terminal 21 will be also referred to as an N terminal 21 and the output terminal 22 will be referred to as an O terminal 22. The P terminal 20, the N terminal 21, and the O terminal 22 will be also referred to as terminals 20, 21 and 22.

The first semiconductor chip 13 includes an IGBT 11 and an FWD formed in a semiconductor substrate and the FWD is connected in reverse parallel to the IGBT 11. That is, a Reverse Conducting (RC)-IGBT is formed in the first semiconductor chip 13. The IGBT 11 and the FWD have so-called vertical type structure that flows a current in the thickness direction of the first semiconductor chip 13, that is, in the Z direction.

In the present embodiment, the semiconductor device 10 includes, as the first semiconductor chip 13, the first semiconductor chip 131 in which the IGBT 11 and the FWD of the upper arm are formed, and the first semiconductor chip 132 in which the IGBT 11 and the FWD of the lower arm are formed. A collector electrode 13a is formed at a surface (which is referred to as a collector surface) of the first semiconductor chip 13 and an emitter electrode 13b is formed at a surface (which is referred to as an emitter surface) opposite to the collector surface. The collector electrode 13a is formed at an almost entire surface facing the heat sink 15. The emitter surface includes an active region in which the emitter electrode 13b is formed and a peripheral region different from the active region. In the peripheral region, multiple pads including a pad electrically connected to the gate electrode are disposed. The collector electrode 13a corresponds to a first metal layer.

The first semiconductor chips 131 and 132 have almost the same planar shape and almost the same size as each other. The first semiconductor chips 131 and 132 have almost planar rectangular shape. As shown in FIG. 4, the first semiconductor chips 131 and 132 are located at almost the same height in the Z direction. As shown by broken lines in FIG. 2 and FIG. 3, the semiconductor chips 131 and 132 are arranged in X direction. The first semiconductor chips 131 and 132 are disposed so that the collector electrode 13a faces the heat sink 15.

In the present embodiment, the first semiconductor chip 13 (131, 132) is formed of silicon (Si). Accordingly, the first semiconductor chip 13 is provided by the IGBT 11 and the FWD formed in the semiconductor substrate formed of Si.

The second semiconductor chip 14 is provided by a MOSFET 12 formed in a semiconductor substrate that is formed of a semiconductor material having greater Young's modulus than the first semiconductor chip 13. The MOSFET 12 has so-called vertical type structure that flows a current in the thickness direction of the second semiconductor chip 14, that is, in the Z direction.

In the present embodiment, the semiconductor device 10 includes, as the second semiconductor chip 14, the second semiconductor chip 141 in which the MOSFET 12 of the upper arm is formed, and the second semiconductor chip 142 in which the MOSFET 112 of the lower arm is formed. A drain electrode 14a is formed at a surface (which is referred to as a drain surface) of the second semiconductor chip 14 and a source electrode 14b is formed at a surface (which is referred to as a source surface) opposite to the drain surface. The drain electrode 14a is formed at an almost entire surface facing the heat sink 15. The drain surface of the second semiconductor chip 14 is located at the same side in the Z direction as the collector surface of the first semiconductor chip 13. The source surface includes an active region in which the source electrode 14b is formed and a peripheral region different from the active region. In the peripheral region, multiple pads including a pad electrically connected to the gate electrode are disposed. The drain electrode 14a corresponds to a second metal layer. Hereinafter, the collector electrode 13a and the drain electrode 14a will be also referred to as electrodes 13a and 14a.

The second semiconductor chips 141 and 142 have almost the same planar shape and almost the same size as each other. The second semiconductor chips 141 and 142 have almost planar rectangular shape. As shown by broken lines in FIG. 2 and FIG. 3, a size of each of the semiconductor chips 141 and 142 is larger than the first semiconductor chip 13. As shown in FIG. 5, the second semiconductor chips 141 and 142 are located at almost the same height in the Z direction, and the semiconductor chips 141 and 142 are arranged in X direction. The second semiconductor chips 141 and 142 are disposed so that the drain electrode 14a faces the heat sink 15. For example, as shown in FIG. 2, the first semiconductor chip 131, the second semiconductor chip 141, the first semiconductor chip 132 and the second semiconductor chip 142 are arranged in this order in the X direction.

In the present embodiment, the second semiconductor chip 14 is formed of silicon carbide (SiC). Accordingly, the second semiconductor chip 14 is provided by the MOSFET 12 formed in the semiconductor substrate that is formed of SiC. Hereinafter, the first semiconductor chip 13 and the second semiconductor chip 14 will be also referred to as semiconductor chips 13 and 14.

In the Z direction, the heat sink 15 is disposed to face the collector surface of the first semiconductor chip 13 and the drain surface of the second semiconductor chip 14. On the other hand, the heat sink 16 is disposed to face the emitter surface of the first semiconductor chip 13 and the source surface of the second semiconductor chip 14. As described above, in the present embodiment, the semiconductor device 10 includes, as the heat sinks 15 and 16, heat sinks 151 and 161 and heat sinks 152 and 162. The first semiconductor chip 131 and the second semiconductor chip 141 of the upper arm are sandwiched between the heat sinks 151 and 161. The first semiconductor chip 132 and the second semiconductor chip 142 of the lower arm are sandwiched between the heat sinks 152 and 162. That is, the semiconductor device 10 includes the heat sinks 151 and 152 as the heat sink 15, and includes the heat sinks 161 and 162 as the heat sink 16.

The heat sinks 151 and 161 corresponding to the upper arm are disposed to include the first semiconductor ship 131 and the second semiconductor chip 141 of the upper arm in a projection view in the Z direction. The heat sinks 152 and 162 corresponding to the lower arm are disposed to include the first semiconductor chip 132 and the second semiconductor chip 142 of the lower arm in the projection view in the Z direction. In the present embodiment, each of the heat sinks 151, 152, 161 and 162 has an almost planar rectangular shape.

The heat sinks 15 and 16 have functions of releasing heat generated in the corresponding semiconductor chips 13 and 14 to the exterior of the semiconductor device 10. In the present embodiment, in addition to the functions of releasing the heat, the heat sinks 15 and 16 have functions of electrically connecting, that is, functions as wirings. The heat sink 15 and 16 are formed of metal materials such as copper in order to secure heat conductivity and electrical conductivity.

The first semiconductor chip 13 and the second semiconductor chip 14 are disposed on a surface 15a of the heat sink 15. As shown in FIG. 4 and FIG. 5, a solder 24 is disposed between the heat sink 15 and the collector electrode 13a of the first semiconductor chip 13. The solder 24 thermally and electrically connects the heat sink 15 and the collector electrode 13a. As shown in FIG. 5, a solder 2 is disposed between the surface 15a of the heat sink 15 and the drain electrode 14a of the second semiconductor chip 14. The solder 25 thermally and electrically connects the heat sink 15 and the drain electrode 14a. The heat sink 15 corresponds to a metal member and the solder 24 corresponds to a first solder. The solder 25 corresponds to a second solder.

Specifically, the first semiconductor chip 131 and the second semiconductor chip 141 of the upper arm are disposed on the surface 15a of the heat sink 151. The solder 24 is disposed between the heat sink 151 and the collector electrode 13a of the first semiconductor chip 131. The solder 24 thermally and electrically connects the heat sink 151 and the collector electrode 13a of the first semiconductor chip 131. The solder 25 is disposed between the heat sink 151 and the drain electrode 14a of the second semiconductor chip 141. The solder 25 thermally and electrically connects the heat sink 151 and the drain electrode 14a of the second semiconductor chip 141.

Similarly, the first semiconductor chip 132 and the second semiconductor chip 142 of the lower arm are disposed on the surface 15a of the heat sink 152. The solder 24 is disposed between the heat sink 152 and the collector electrode 13a of the first semiconductor chip 132. The solder 24 thermally and electrically connects the heat sink 152 and the collector electrode 13a of the first semiconductor chip 132. The solder 25 is disposed between the heat sink 152 and the drain electrode 14a of the second semiconductor chip 142. The solder 25 thermally and electrically connects the heat sink 152 and the drain electrode 14a of the second semiconductor chip 142.

A surface of the heat sink 15 (151 and 152) opposite to the surface 15a is a radiation surface 15b that is exposed from a surface 19a of the sealing resin 19 in the Z direction. In the present embodiment, the radiation surface 15b is almost the same surface as the surface 19a.

As shown in FIG. 3 and FIG. 4, the heat sink 152 of the lower arm of the heat sink 15 has a joint 152a. The joint 152a is thinner than the other portion (i.e., a body) of the heat sink 152. The joint 152a is extended toward the heat sink 161 from a side surface of the heat sink 152 facing the heat sink 151 and the joint 152a includes two flexions. That is, the joint 152a is extended in the X direction and the Z direction.

As shown in FIG. 3, the P terminal 20 is connected to the heat sink 151 of the upper arm. The P terminal 20 is electrically connected to the high-potential power line 5. The P terminal 20 may be integrally provided with the heat sink 16. The P terminal 20 may be provided separately from the heat sink 15 and may be connected to the heat sink 15. As shown in FIG. 2, the P terminal 20 is extended in the Y direction and protrudes from the side surface 19c of the sealing resin 19 to the exterior.

As shown in FIG. 3, the O terminal 21 is connected to the heat sink 152 of the lower arm. The O terminal 21 is electrically connected to the output line 7. The O terminal 21 may be integrally provided with the heat sink 152. The O terminal 21 may be provided separately from the heat sink 152 and may be connected to the heat sink 152. The O terminal 21 is extended in the Y direction and, similarly to the P terminal 20, protrudes from the side surface 19c of the sealing resin 19 to the exterior. The O terminal 21 may be connected to the heat sink 161 of the upper arm. Two O terminals 21 respectively connected to the heat sinks 152 and 161 may be provided.

The heat sink 16 is disposed to face the emitter surface of the first semiconductor chip 13 and the source surface of the second semiconductor chip 14. As shown in FIG. 4 and FIG. 5, a terminal 17 is disposed between the first semiconductor chip 13 and the heat sink 16. As shown in FIG. 5, a terminal 18 is disposed between the second semiconductor chip 14 and the heat sink 16. The terminal 17 corresponds to a first terminal and the terminal 18 corresponds to a second terminal.

The terminal 17 secures a height to connect the signal terminals 23 and the pads of the first semiconductor chip 13 through the bonding wires 26. The terminal 17 is formed of at least a metal material in order to secure the thermal conductivity and the electrical conductivity to thermally and electrically connect the emitter electrode 13b of the first semiconductor chip 13 and the heat sink 16. The terminal 17 is disposed to face the emitter electrode 13b of the emitter surface of the first semiconductor chip 13 and is electrically connected to the emitter electrode 13b through the solder 27.

Similarly, the terminal 18 secures a height to connect the signal terminals 23 and the pads of the second semiconductor chip 14 through the bonding wires 26. The terminal 18 is formed of at least a metal material in order to secure the thermal conductivity and the electrical conductivity to thermally and electrically connect the source electrode 14b of the second semiconductor chip 14 and the heat sink 16. The terminal 18 is disposed to face the source electrode 14b of the source surface of the second semiconductor chip 14 and is electrically connected to the source electrode 14b through the solder 28.

The heat sink 16 is disposed so that the most part of the heat sink 16 is overlapped with the corresponding heat sink 15 in the projection view in the Z direction. Specifically, the heat sink 161 of the upper arm is disposed to be overlapped with the heat sink 151, and the heat sink 162 of the lower arm is disposed to be overlapped with the heat sink 152. The heat sink 16 is disposed to face the surfaces of the terminals 17 and 18 opposite to the semiconductor chips 13 and 14.

As shown in FIG. 4 and FIG. 5, a solder 29 is disposed between the surface 16a of the heat sink 16 and the terminal 17. The solder 29 thermally and electrically connects the heat sink 16 and the terminal 17. As shown in FIG. 5, a solder 30 is disposed between the surface 16a of the heat sink 16 and the terminal 18. The solder 30 thermally and electrically connects the heat sink 16 and the terminal 18.

Specifically, the terminal 17 is disposed between the surface 16a of the heat sink 161 and the first semiconductor chip 131 of the upper arm and the solder 27 connects the emitter electrode 13b of the first semiconductor chip 131 and the terminal 17. The solder 29 connects the terminal 17 and the heat sink 161. The terminal 18 is disposed between the surface 16a of the heat sink 161 and the second semiconductor chip 141 of the upper arm and the solder 28 connects the source electrode 14b of the second semiconductor chip 141 and the terminal 17. The solder 30 connects the terminal 18 and the heat sink 161.

Similarly, the terminal 17 is disposed between the surface 16a of the heat sink 162 and the first semiconductor chip 132 of the lower arm, and the solder 27 connects the emitter electrode 13b of the first semiconductor chip 132 and the terminal 17. The solder 29 connects the terminal 17 and the heat sink 162. The terminal 18 is disposed between the surface 16a of the heat sink 162 and the second semiconductor chip 142 of the lower arm and the solder 28 connects the source electrode 14b of the second semiconductor chip 142 and the terminal 17. The solder 30 connects the terminal 18 and the heat sink 162.

A surface of the heat sink 16 opposite to the surface 16a is a radiation surface 16b that is exposed from the rear surface 19b of the sealing resin 19 opposite to the surface 19a. In the present embodiment, the radiation surface 16b is almost the same surface as the rear surface 19b.

The heat sink 161 of the upper arm of the heat sink 16 has a joint 161a. The joint 161a is thinner than the other portion (i.e., a body) of the heat sink 161. The joint 161a is extended in the X direction from a part of a side surface of the heat sink 161 facing the heat sink 162. A head portion of the joint 161a and a head portion of the joint 152a face with each other in the Z direction and are electrically connected through the solder 31.

The heat sink 162 of the lower arm has a joint 162a. The joint 162a is thinner than the other portion (i.e., a body) of the heat sink 162. The joint 162a is extended in the X direction from a part of a side surface of the heat sink 162 facing the heat sink 161. The N terminal is electrically connected to the joint 162a.

The N terminal 21 is electrically connected to the low-potential power source 6. The N terminal 21 is electrically connected to the joint 162a of the heat sink 162. The N terminal 21 is extended in the Y direction and, similarly to the P terminal 20 and the O terminal 21, protrudes from the side surface 19c of the sealing resin 19 to the exterior. The portions of the terminals 20, 21 and 22 protruding from the sealing resin 19 are located at almost the same position in the Z direction. The P terminal 20, the N terminal 21 and the O terminal 22 are arranged in this order in the Y direction.

The signal terminals 23 are electrically connected to the pads of the corresponding semiconductor chips 13 and 14 through the bonding wires 26. The signal terminals 23 are extended in the Y direction and protrude from a side surface 19d opposite to the side surface 19c of the sealing resin 19 toward outside.

The sealing resin 19 integrally seals the semiconductor chips 13 and 14, parts of the heat sinks 15 and 16, the terminals 17 and 18, and parts of the terminals 20, 21, 22 and 23. For example, the sealing resin 19 is formed of an epoxy-type resin and is molded by a transfer mold method. As shown in FIG. 2, the sealing resin 19 has an almost planar rectangular shape. The P terminal 20, N terminal 21 and the O terminal 22 as main terminals are drawn from the side surface 19c, which is almost parallel with the X direction. The signal terminals 23 are drawn the side surface 19d opposite to the side surface 19c.

The above described semiconductor device 10 is a so-called 4 in 1 package that includes two first semiconductor chips 13 (i.e., 131 and 132) and two second semiconductor chips 14 (i.e., 141 and 142). The heat sinks 15 and 16 are disposed at the both sides in the Z direction of the semiconductor chips 13 and 14 to release the heat of the semiconductor chips 13 and 14 toward the both sides.

In the upper arm, the heat sink 15 (i.e., 151), the solders 24 and 25, the first semiconductor chip 13 (i.e., 131) and the second semiconductor chip 14 (i.e., 141) of the upper arm, the solders 27 and 28, the terminals 17 and 18, the solders 29 and 30, and the heat sink 16 (i.e., 161) are disposed in this order in the Z direction from the surface 19a. In the lower arm, the heat sink 15 (i.e., 152), the solders 24 and 25, the first semiconductor chip 13 (i.e., 132) and the second semiconductor chip 14 (i.e., 141) of the lower arm, the solders 27 and 28, the terminals 17 and 18, the solders 29 and 30, and the heat sink 16 (i.e., 162) are disposed in this order in the Z direction from the surface 19a. That is, the order in the Z direction is the same in the upper arm and the lower arm.

Figure 6:
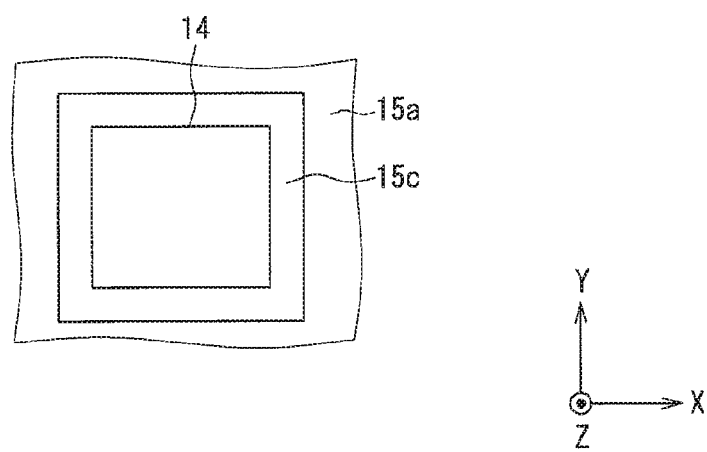
FIG. 6 is a plan view illustrating a positional relationship between a second semiconductor chip and a recess in the semiconductor device according to the first embodiment.

Next, connection structures of the first semiconductor chip 13 and the second semiconductor chip 14 will be described with reference to FIG. 5 and FIG. 6. FIG. 6 illustrates a positional relationship between the second semiconductor chip 14 and a recess 15c which will be described later. In FIG. 6, the illustration of the solder 25 is omitted for convenience.

As shown in FIG. 5, the heat sink 15 has a recess 15c formed at the surface 15a correspondingly to the second semiconductor chip 14. For details, the recesses 15c are formed in the heat sinks 151 and 152 corresponding to the second semiconductor chips 141 and 142. The recess 15c is formed so that a thickness of the solder 25 is greater than the maximum thickness of the solder 24 of the first semiconductor chip 13 (i.e., the collector electrode 13a) at least at a portion of the solder 25 corresponding to a part of an outer peripheral edge of the drain electrode 14a.

For example, in FIG. 5, at least a part of the solder 25 is accommodated in the recess 15c. Therefore, the thickness of the solder 25 is greater than the maximum thickness of the solder 24 at least at the portion of the solder 25 corresponding to the part of the outer peripheral edge of the drain electrode 14a The maximum thickness of the solder 24 is a thickness of the thickest part of the solder 24. In the present embodiment, a part of the surface 15a of the heat sink 15 except for a part at which the recess 15c is formed is a flat surface. The first semiconductor chip 13 is disposed so that the collector surface is parallel to the flat surface. Therefore, the thickness of the solder 24 is uniform almost in the entire region. The outer peripheral edge of the drain electrode 14a corresponds to an edge portion when the drain electrode 14a is viewed from Z direction.

In the present embodiment, as shown in FIG. 5 and FIG. 6, the recess 15c is formed so that the entirety of the second semiconductor chip 14 is included in the recess 15c in the projection view in the Z direction. That is, the recess 15c is formed so as to include the drain electrode 14a. Not only at the outer peripheral edge of the drain electrode 14a, the thickness of the solder 25 is greater than the maximum thickness of the solder 21 at an entirety of the drain electrode 14a.

Next, an example of a manufacturing method of the semiconductor device 10 will be described.

First, the semiconductor chips 13 and 14, the heat sinks 15 and 16, and the terminals 17 and 18 are prepared. The heat sink 15 having the recess 15c is prepared.

Then, a first reflow step is conducted.

First, the first semiconductor chip 13 is disposed on the surface 15a of the heat sink 15 through the solder 24 (e.g., a solder foil), and the second semiconductor chip 14 is disposed on the surface 15a of the heat sink 15 through the solder 25. The first semiconductor chip 13 and the second semiconductor chip 14 are disposed so that the collector electrode 13a and the drain electrode 14a face the surface 15a. Next, the terminal 17 is disposed above the first semiconductor chip 13. For example, the solders 27 and 29 to be received are disposed at the both sides of the terminal 17. The terminal 17 is disposed so that the solder 27 faces the first semiconductor chip 13. Similarly, the terminal 18 is disposed above the second semiconductor chip 14. For example, the solders 28 and 30 to be received are disposed at the both sides of the terminal 18. The terminal 18 is disposed so that the solder 28 faces the second semiconductor chip 14. A generous amount of the solders 29 and 30 are disposed so as to reduce tolerance variation of the height of the semiconductor device 10.

The solders 24, 25, 27 and 28 are reflowed (i.e., 1st reflow) while being laminated in this order. As such, the collector electrode 13a of the first semiconductor chip 13 is connected to the heat sink 15 through the solder 24, and the emitter electrode 13b of the first semiconductor chip 13 is connected to the terminal 17 through the solder 27. Since the heat sink 16 to be connected to the solder 29 is not disposed at this point, the solder 29 has a shape rising at the center of the surface of the terminal 17 facing the heat sink 16 due to surface tension. Similarly, by the 1st reflow, the drain electrode 14a of the second semiconductor chip 14 is connected to the heat sink 15 through the solder 25, and the source electrode 14b of the second semiconductor chip 14 is connected to the terminal 18 through the solder 28. The solder 30 also has a shape rising at the center of the surface of the terminal 18 facing the heat sink 16.

Next, the signal terminals 23 and the pads of the semiconductor chips 13 and 14 are connected through the bonding wires 26.

A connected group obtained by the 1st reflow (hereinafter, referred to as a unit connected group) is disposed on the surface 16a of the heat sink 16. Then, a reflow (i.e., 2nd reflow) is conducted while placing the heat sink 16 downward. The reflow is conducted while applying a load to a structure including the connected group laminated on the heat sink and while keeping the height of the semiconductor device 10 to a predetermined height by using a spacer. As such, the terminal 17 and the heat sink 16 are connected through the solder 29, and the terminal 18 and the heat sink 16 are connected through the solder 30. Since the generous amount of the solders 29 and 30 are provided between the terminals 17 and 18 and the heat sink 16 as described above, the solders 29 and 30 are sufficient in the 2nd reflow to achieve certain connection.

Next, the sealing resin 19 is molded by the transfer mold method. In the present embodiment, the sealing resin 19 is formed so that the heat sinks 15 and 16 are fully covered. After the sealing resin 19 is molded, a part of the sealing resin 19 adjacent to the surface 19a is cut together with a part of the heat sink 15 (i.e., 151 and 152) and the radiation surface 15b of the heat sink 15 is exposed. Similarly, a part of the sealing resin 19 adjacent to the rear surface 19b is cut together with a part of the heat sink 16 (i.e., 161 and 162) and the radiation surface 16b of the heat sink 16 is exposed. As a result, the radiation surface 15b is in almost the same plane as the surface 19a of the sealing resin 19, and the radiation surface 16b is in almost the same plane as the rear surface 19b of the sealing resin 19. As a result of this cutting of the both surfaces, flatness of the radiation surfaces 15b and 16b, and parallelism of the radiation surfaces 15b and 16b are secured.

The sealing resin may be molded while pressing and attaching the radiation surfaces 15b and 16b of the heat sinks 15 and 16 to a wall surface of a cavity of a metal mold. In this case, when the sealing resin 19 is molded, the radiation surfaces 15b and 16b are exposed from the sealing resin 19. Therefore, the cutting after the molding may be omitted.

Finally, unnecessary portions of the lead frame are removed to obtain the semiconductor device 10. The removing the unnecessary portions may be conducted before the cutting.

Next, effects of the above described semiconductor device 10 will be described.

In the solders 24 and 25 disposed between the semiconductor chips 13, 14 and the heat sink 15, thermal stress is especially concentrated to the portion corresponding to the outer peripheral edge of the corresponding electrodes 13a and 14a. The thermal stress is based on differences between linear expansion coefficients between the semiconductor chips 13, 14 and the heat sink 15. The first semiconductor chip 13 is formed of Si and the second semiconductor chip 14 is formed of SiC. The second semiconductor chip 14 is less likely to deform than the first semiconductor chip 13, that is, the second semiconductor chip 14 is harder than the semiconductor chip 13. The semiconductor chip 14 is less likely to be affected by circumjacent deformation. Accordingly, thermal stress concentrated to the solder 25 is greater than thermal stress concentrated to the solder 24. In the present embodiment, the thickness of the solder 25 (i.e., the second solder) is greater than the maximum thickness of the solder 24 (i.e., the first solder) at least at the portion of the solder 25 corresponding to the part of the outer peripheral edge of the drain electrode 14a (i.e., the second metal layer). As a result, compared to a structure in which the solder 25 is not thickened, the reliability of the connection of the solder 25 is increased.

The first semiconductor chip 13 includes the IGBT 11 in which current flows in the large-current region, and the second semiconductor chip 14 includes the MOSFET 12 in which current flows in the small-current region. That is, the quantity of heat generated in the first semiconductor chip 13 is larger than the quantity of heat generated in the second semiconductor chip 14. In the present embodiment, the thicknesses of the solder 24 and the solder 25, which are disposed on the surface 15a of the same heat sink 15, are not uniformly increased, but the thickness of at least a part of the solder 25 is increased than the maximum thickness of the solder 24. As a result, the heat radiation performance of the first semiconductor chip 13, which generates larger heat than the second semiconductor chip 14, is secured while increasing the reliability of the connection of the solder 25.

Especially in the present embodiment, the thickness of the solder 25 is greater than the maximum thickness of the solder 24 not only at the outer peripheral edge of the drain electrode 14a but at the entirety of the drain electrode 14a, that is, at the entirety of the second semiconductor chip 14. Therefore, the reliability of the connection of the solder 25 is further increased compared to the structure in which the thickness of the solder 25 is increased at the part of the solder 25.

In the present embodiment, the recess 15c is locally provided in the heat sink 15 so that the distance between the drain surface of the second semiconductor chip 14 and the surface 15a of the heat sink 15 is greater than the distance between the collector surface of the first semiconductor chip 13 and the surface 15a and thereby to increase the thickness of the solder 25. Accordingly, the heat radiation performance of the first semiconductor chip 13 is secured while increasing the reliability of the connection of the solder 25 by the simple structure.

Second Embodiment

In a second embodiment, portions that are common to the semiconductor device 10 described in the first embodiment will not be repeatedly described.

Figure 7:
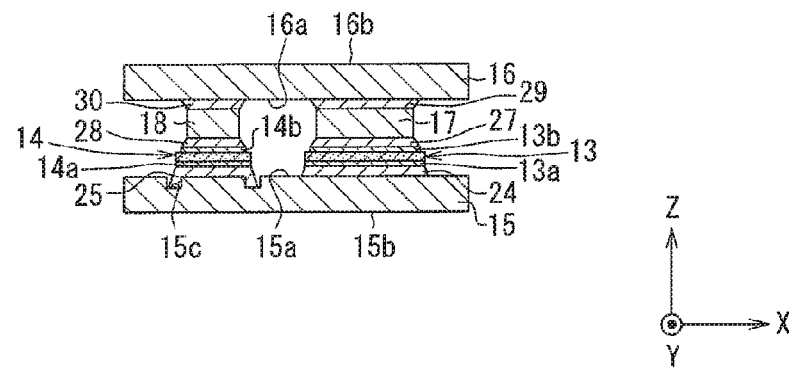
FIG. 7 is a cross-sectional view, which corresponds to FIG. 5, illustrating connection structures of a first semiconductor chip and a second semiconductor chip in a semiconductor device according to a second embodiment.
Figure 8:
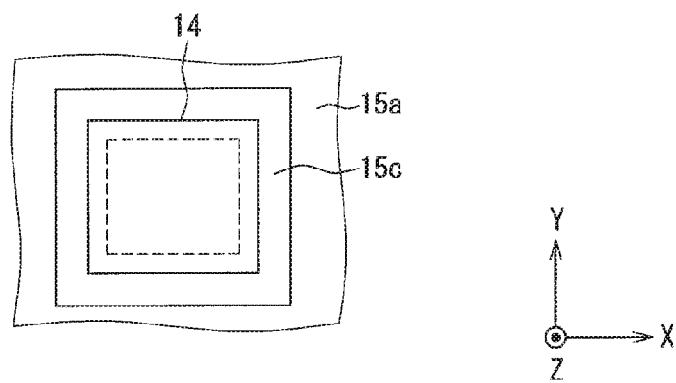
FIG. 8 is a plan view illustrating a positional relationship between a second semiconductor chip and a recess in the semiconductor device according to the second embodiment.

As shown in FIG. 7, in the second embodiment, the thickness of the solder 25 is greater than the maximum thickness of the first solder 24 at an entire periphery of the outer peripheral edge of the drain electrode 14a. Specifically, as shown in FIG. 8, the recess 15c is annularly formed to include the entire periphery of the outer peripheral edge of the drain electrode 14a, that is, the second semiconductor chip 14. In FIG. 8, an inner peripheral edge of the recess 15c is shown by a broken line. Similarly to FIG. 6, the illustration of the solder 25 is omitted in FIG. 8.

In the second embodiment, similar effects to the first embodiment are achieved. Especially in the second embodiment, the thickness of the solder 25 is increased at the entire periphery of the outer peripheral edge of the drain electrode 14a, to which the thermal stress is concentrated. As a result, the reliability of the connection of the solder 25 is further increased. Compared to the structure in which the thickness of the solder 25 is increased at the entirety of the drain electrode 14a, the reliability of the connection of the solder 25 is increased while reducing the amount of the solder 25.

In the examples shown in FIG. 7 and FIG. 8, the recess 15c is formed in the rectangular annular shape. However, the planer structure of the recess 15c is not limited to the examples. For example, the recess 15c may be formed in a shape having rounded corners and including the entire periphery of the outer peripheral edge of the drain electrode 14a. The cross-sectional shape is not especially limited. For example, the recess 15c may have the cross-sectional shape of hemicycle.

Third Embodiment

In a third embodiment, portions that are common to the semiconductor device 10 described in the first embodiment will not be repeatedly described.

In the third embodiment, the thickness of the solder 25 is greater than the maximum thickness of the first solder 24 at corners (i.e., angles) of the drain electrode 14a having almost planar rectangular shape. The drain electrode 14a is formed in almost the entire surface of the second semiconductor chip 14 facing the heat sink 15. The corners of the drain electrode 14a are almost coincident with the corners of the second semiconductor chip 14. Therefore, the thickness of the solder 25 is greater than the maximum thickness of the first solder 24 at the corners 14c of the second semiconductor chip 14 having almost planar rectangular shape.

Figure 9:
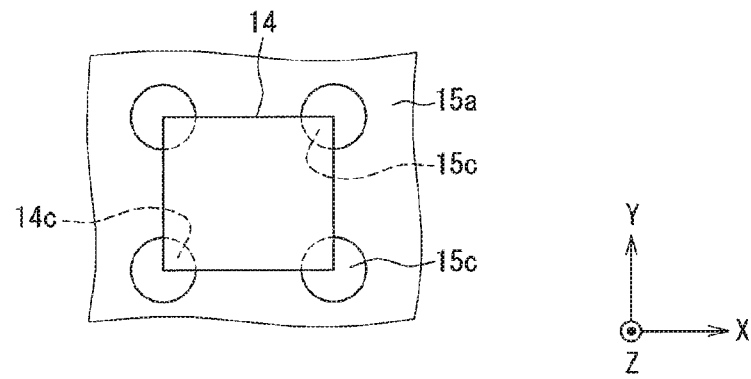
FIG. 9 is a plan view illustrating a positional relationship between a second semiconductor chip and a recess in the semiconductor device according to the third embodiment.

Specifically, as shown in FIG. 9, the recesses 15c are respectively formed to correspond to four corners 14c of the second semiconductor chip 14. Each of the recesses 15c is integrally formed in a region just under the corner 14c and a region around the corner 14c and not being overlapped with the second semiconductor chip 14. The part of the recess 15c is overlapped with the corner 14c in the projection view in the Z direction. Similarly to FIG. 6, the illustration of the solder 25 is omitted in FIG. 9. The cross-section along a diagonal line of the planar rectangular shape of the second semiconductor chip 14 in FIG. 9 is coincident with the cross-section shown in FIG. 7.

In the almost rectangular shape, the thermal stress is especially concentrated to the portions of the outer peripheral edge of the drain electrode 14a corresponding to the corners. According to the third embodiment, the thickness of the solder 25 at the portions corresponding to the corners of the outer peripheral edge of the drain electrode 14a is increased. Therefore, the reliability of the connection of the solder 25 is increased while further reducing the amount of the solder 25.

The planar shape of the drain electrode 14a is not limited to the almost rectangular shape. When the planar shape of the drain electrode 14a is polygonal shape, similar effects to the above embodiments are achieved by increasing the thickness of the solder 25 than the maximum thickness of the first solder 24 at the portions of the outer peripheral edge corresponding to the corners of the drain electrode 14a.

Fourth Embodiment

In a fourth embodiment, portions that are common to the semiconductor device 10 described in the first embodiment will not be repeatedly described.

Figure 10:
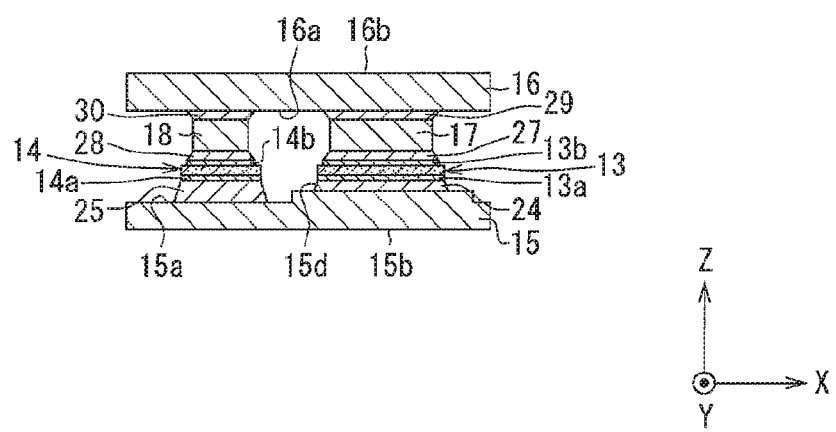
FIG. 10 is a cross-sectional view, which corresponds to FIG. 5, illustrating connection structures of a first semiconductor chip and a second semiconductor chip in a semiconductor device according to a fourth embodiment.
Figure 11:
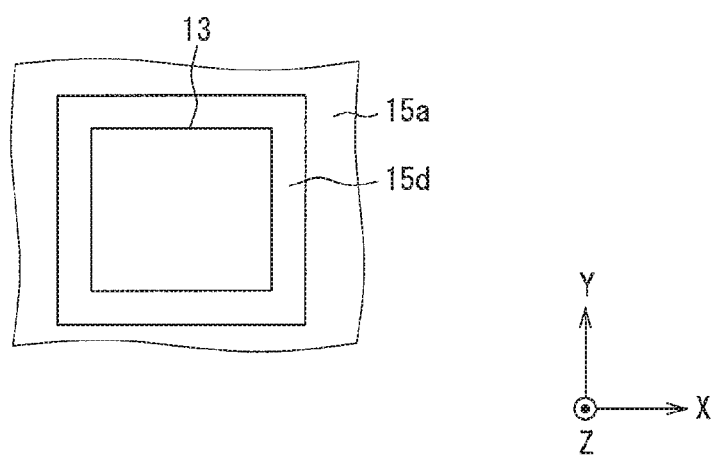
FIG. 11 is a plan view illustrating a positional relationship between a first semiconductor chip and a protrusion in the semiconductor device according to the fourth embodiment.

As shown in FIG. 10 and FIG. 11, in the fourth embodiment, a protrusion 15d is formed at the surface 15a of the heat sink 15 so that the protrusion 15d includes the first semiconductor chip 13 in the projection view in the Z direction. That is, the protrusion 15d is formed to include the collector electrode 13a (the first metal layer). The protrusion 15d corresponds to a first protrusion. The part of the surface 15a other than the protrusion 15d is flat. FIG. 11 shows a positional relationship of the first semiconductor chip 11 and the protrusion 15d. The illustration of the solder 24 is omitted for convenience.

For example, in FIG. 10, the solder 24 is disposed on the protrusion 15d.

Due to the protrusion 15d, a facing distance between the first semiconductor chip 13 and the surface 15a of the heat sink 15 (that is, a top surface of the protrusion 15d) is shorter than a facing distance between the second semiconductor chip 14 and the surface 15a. That is, the facing distance between the second semiconductor chip 14 and the surface 15a is greater than the facing distance between the first semiconductor chip 13 and the surface of the heat sink 15. Accordingly, the thickness of the solder 25 is greater than the maximum thickness of the solder 24 at the entirety of the drain electrode 14*a*. As a result, similarly to the first embodiment, the heat radiation performance of the first semiconductor chip 13 is further increased while increasing the reliability of the connection of the solder 25.

Fifth Embodiment

In a fifth embodiment, portions that are common to the semiconductor device 10 described in the first embodiment will not be repeatedly described.

Figure 12:
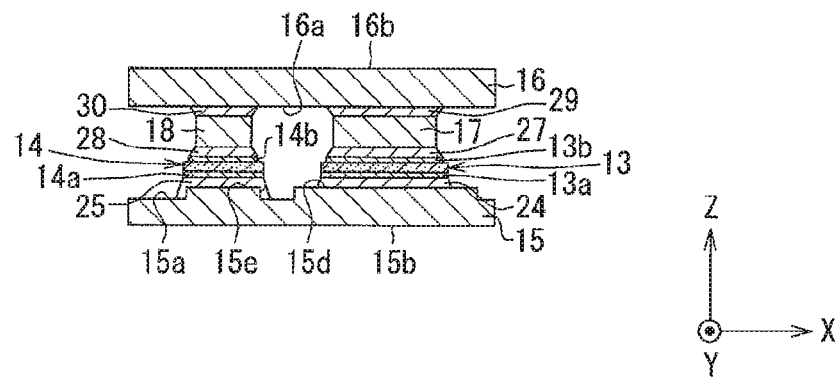
FIG. 12 is a cross-sectional view, which corresponds to FIG. 5, illustrating connection structures of a first semiconductor chip and a second semiconductor chip in a semiconductor device according to a fifth embodiment.
Figure 13:
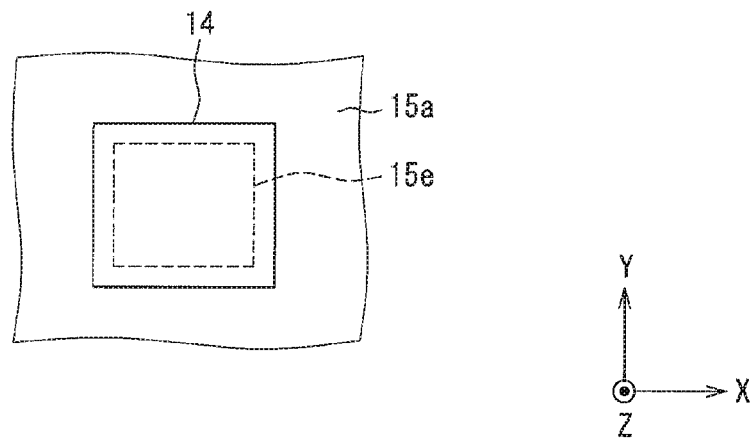
FIG. 13 is a plan view illustrating a positional relationship between a second semiconductor chip and a protrusion in the semiconductor device according to the fifth embodiment.

As shown in FIGS. 12 and 13, in the fifth embodiment, the protrusion 15*e* is formed at the surface 15*a* of the heat sink 15 in addition to the protrusion 15*d* described in the fourth embodiment. The protrusion 15*e* is formed to be included in the drain electrode 14*a* (i.e., the second metal layer) in the projection view in the Z direction. That is, the protrusion 15*e* is formed to be included in the second semiconductor chip 14.

The protrusion 15*e* faces the part of the drain electrode 14*a*. In the projection view in the Z direction, the outer peripheral edge of the drain electrode 14*a* is not overlapped with the protrusion 15*e*. The planar shape of the protrusion 15*e* is almost rectangular shape. The planar shape of the protrusion 15*e* and the planar shape of the drain electrode 14*a* are in similarity relationship (i.e., the planar shape of the protrusion 15*e* is homothetic to the planar shape of the drain electrode 14*a*). The protrusion 15*e* corresponds to a second protrusion. The heights of the protrusions 15*d* and 15*e* are almost the same as each other. However, the height of the protrusions 15*d* and 15*e* may be different. In FIG. 13, the outer peripheral edge of the protrusion 15*e* is shown by the broken line. Similarly to FIG. 6, the illustration of the solder 25 is omitted in FIG. 13.

For example, in FIG. 12, the solder 24 is disposed on the protrusion 15*d*. The part of the solder 25 corresponding to the entire periphery of the outer peripheral edge of the drain electrode 14*a* is disposed on the heat sink 15. The remaining part of the solder 25 other than the part of the solder 25 corresponding to the entire periphery of the outer peripheral edge of the drain electrode 14*a* is disposed on the protrusion 15*e*.

As described above, the protrusions 15*d* and 15*e* causes the facing distance between the first semiconductor chip 13 and the surface 15*a* of the heat sink being shorter than the facing distance between the portion of the second semiconductor chip 14 not facing the protrusion 15*e* and the surface 15*a*. That is, the facing distance between the outer peripheral edge of the drain electrode 14*a* and the surface 15*a* is greater than the facing distance of the collector electrode 13*a* and the protrusion 15*d*. The facing distance between the outer peripheral edge of the drain electrode 14*a* and the surface 15*a* is greater than the facing surface of the drain electrode 14*a* and the top surface of the protrusion 15*e*.

Accordingly, the thickness of the solder 25 is greater than the maximum thickness of the solder 24 at the entire periphery of the outer peripheral edge of the drain electrode 14*a*. Therefore, similarly to the second embodiment, the heat radiation performance of the first semiconductor chip 13 is increased while increasing the reliability of the connection of the solder 25.

Sixth Embodiment

In a sixth embodiment, portions that are common to the semiconductor device 10 described in the third embodiment will not be repeatedly described.

Figure 14:
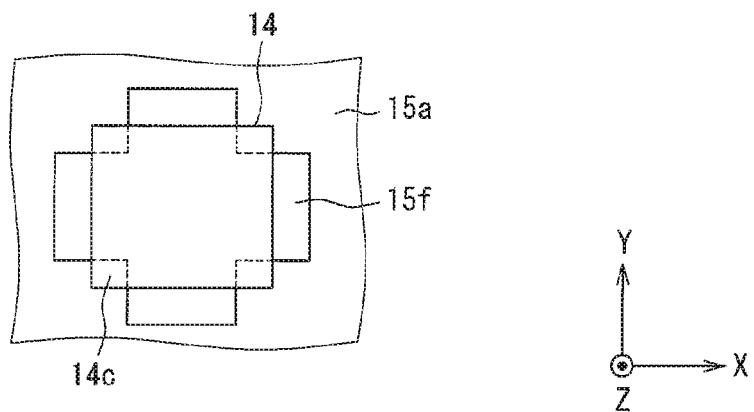
FIG. 14 is a plan view illustrating a positional relationship between a second semiconductor chip and a protrusion in the semiconductor device according to a sixth embodiment.

As shown in FIG. 14, in the sixth embodiment, the protrusion 15*f* is formed at the surface 15*a* of the heat sink 15 in addition to the protrusion 15*d* described in the fourth embodiment. The protrusion 15*f* is formed to be overlapped with the portion of the second semiconductor chip 14 excepting the corners 14*c* in the projection view in the Z direction. That is, the protrusion 15*f* is formed to be overlapped with the portion of the drain electrode 14*a* excepting the corners 14*c*. The protrusion 15*f* corresponds to a third protrusion. Similarly to FIG. 6, the illustration of the solder 25 is omitted in FIG. 14.

In the sixth embodiment, the planar shape of the protrusion 15*f* is an almost cross shape. The protrusion 15*f* is formed to be overlapped with the portion of the second semiconductor chip 14, which has the almost planar rectangular shape, excepting the four corners 14*c*. That is, in the projection view in the Z direction, the corners 14*c* of the second semiconductor chip 14 is not overlapped with the protrusion 15*f*. The heights of the protrusions 15*d* and 15*f* are almost the same as each other. However, the heights of the protrusions 15*d* and 15*f* may be different.

For example, the solder 24 is disposed on the protrusion 15*d* of the solder 24. The part of the solder 25 corresponding to the corners of the drain electrode 14*a* is disposed on the heat sink 15. The part of the solder 25 excepting the part corresponding to the corners of the drain electrode 14*a* is disposed on the protrusion 15*f*.

As described above, due to the protrusions 15*d* and 15*f*, the facing distance between the first semiconductor chip 13 and the surface 15*a* of the heat sink 15 is shorter than the facing distance between the portion of the second semiconductor chip 14 not facing the protrusion 15*f* and the surface 15*a*. That is, the facing distance between the corners of the drain electrode 14*a* and the surface 15*a* is greater than the facing distance of the collector electrode 13*a* and the top surface of the protrusion 15*d*. The facing distance between the corners of the drain electrode 14*a* and the surface 15*a* is greater than the facing distance of the drain electrode 14*a* and the top surface of the protrusion 15*f*.

Accordingly, the thickness of the solder 25 is greater than the maximum thickness of the solder 24 at the corners of the drain electrode 14*a*. The cross-section along a diagonal line of the planar rectangular shape of the second semiconductor chip 14 in FIG. 14 is coincident with the cross-section shown in FIG. 12. Therefore, similarly to the third embodiment, the heat radiation performance of the first semiconductor chip 13 is increased while increasing the reliability of the connection of the solder 25.

Seventh Embodiment

In a seventh embodiment, portions that are common to the semiconductor device 10 described in the first embodiment will not be repeatedly described.

Figure 15:
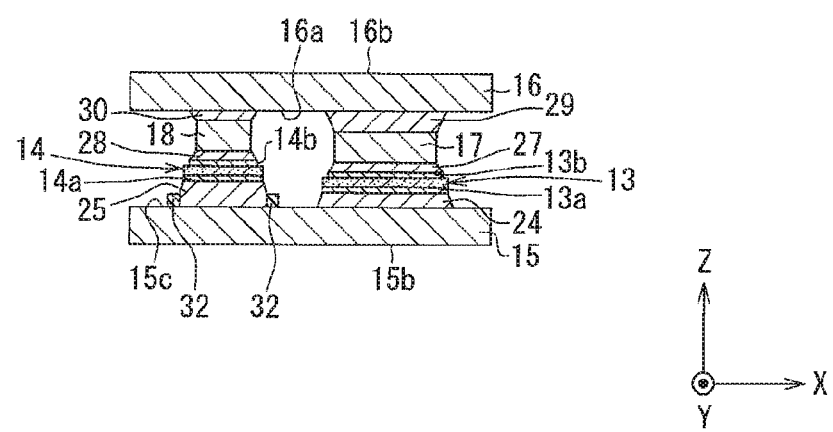
FIG. 15 is a cross-sectional view, which corresponds to FIG. 5, illustrating connection structures of a first semiconductor chip and a second semiconductor chip in a semiconductor device according to a seventh embodiment.
Figure 16:
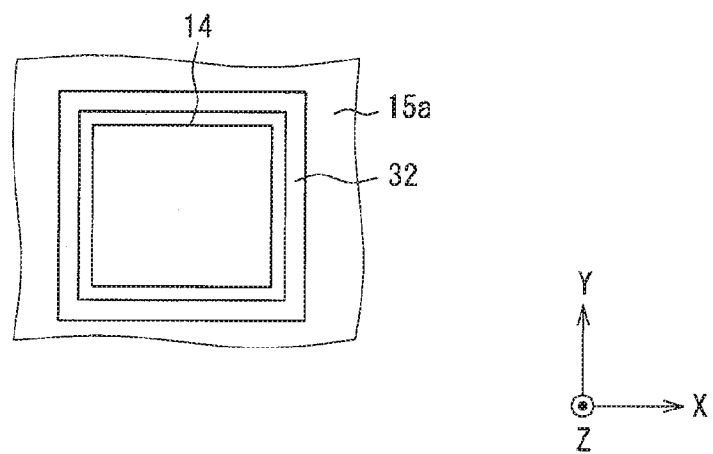
FIG. 16 is a plan view illustrating a positional relationship between a second semiconductor chip and a restriction portion in the semiconductor device according to the seventh embodiment.

As shown in FIG. 15 and FIG. 16, in the seventh embodiment, a suppression 32 is formed at the surface 15*a* of the heat sink 15. The suppression 32 suppresses wetting spread of the solder 25. The suppression 32 is formed annularly to surround the drain electrode 14*a*. For example, the suppression 32 is located close to the outer peripheral edge of the second semiconductor chip 14 so as to surround the second semiconductor chip 14. Similarly to FIG. 6, the illustration of the solder 25 is omitted in FIG. 14.

The suppression 32 may be provided by a protrusion having a specific height to dam up the solder 25, a roughened portion formed by irradiation of laser light, or a lower wetness portion having lower solder wetness against the solder 25 than the metal material of the heat sink 15. For example, the lower wetness portion is formed by an oxidation film.

For example, in FIG. 15, the solder 25 is dammed up by the suppression 32.

The suppression 32 suppresses the solder 25 from spreading compared to the wetting spread of the solder 24 on the surface 15a. The suppression 32 holds the solder 25 just under the second semiconductor chip 14, that is, just under the drain electrode 14a. In the seventh embodiment, during the above described first reflow step, the wetting spread of the solder 25 is suppressed by the suppression 32, and thus the thickness of the solder 25 is greater than the solder 24. As a result, similarly to the first embodiment, the heat radiation performance of the first semiconductor chip 13 is further increased while increasing the reliability of the connection of the solder 25.

As described above, a generous amount of the solders 29 and 30 are disposed so as to reduce tolerance variation of the height of the semiconductor device 10. As the solder 24 is thinner than the solder 25, the solder 29 is thicker than the solder 30.

The structure described in the seventh embodiment may be combined with the other embodiments described above. For example, the suppression 32 may be added to the structure shown in FIG. 10.

Eighth Embodiment

In an eighth embodiment, portions that are common to the semiconductor device 10 described in the first embodiment will not be repeatedly described.

Figure 17:
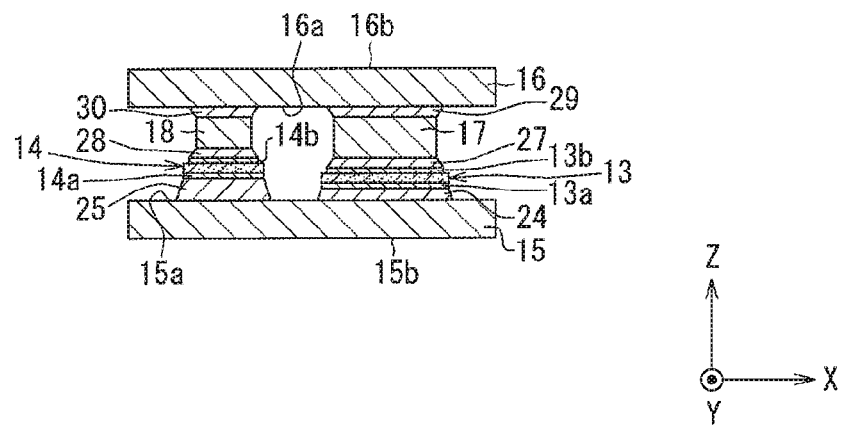
FIG. 17 is a cross-sectional view, which corresponds to FIG. 5, illustrating connection structures of a first semiconductor chip and a second semiconductor chip in a semiconductor device according to an eighth embodiment.

As shown in FIG. 17, in the eighth embodiment, the terminal 18 of the second semiconductor chip 14 is thinner than the terminal 17 of the first semiconductor chip 13, and thus the thickness of the solder 25 is greater than the maximum thickness of the solder 24 at the entirety of the drain electrode 14a.

Similarly to the first embodiment, in the eighth embodiment the heat radiation performance of the first semiconductor chip 13 is further increased while increasing the reliability of the connection of the solder 25.

The structure described in the eighth embodiment may be combined with the other embodiments described above. For example, the suppression 32 may be added to the structure shown in FIG. 17.

Although the embodiment of the present disclosure is described hereinabove, the present disclosure is not limited to the embodiment described above and may be implemented in various other ways without departing from the gist of the present disclosure.

The structure of the semiconductor device 10 is not limited to the above described examples. Although the example is described in which the semiconductor device 10 includes one phase of the upper and the lower arms, the semiconductor device 10 may include three phases of the upper and the lower arms, or the semiconductor device 10 may in include only one of the upper and the lower arms, that is, one set of the first semiconductor chip 13 and the second semiconductor chip 14.

Figure 18:
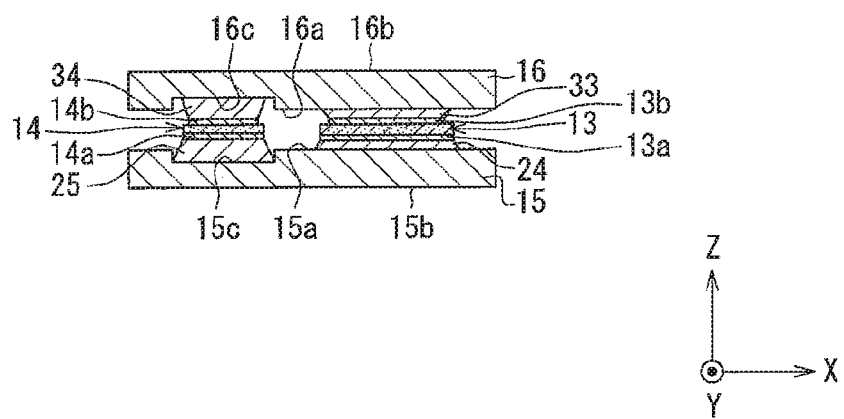
FIG. 18 is a cross sectional view for illustrating a first modification.

A structure that does not include the terminals 17 and 18 may be employed as the semiconductor device 10 having the radiation structure at both surfaces. For example, in a first modification shown in FIG. 18, the collector electrode 13a of the first semiconductor chip 13 is connected to the heat sink 15 through the solder 24, and the drain electrode 14a of the second semiconductor chip 14 is connected to the same heat sink 15 through the solder 25. The emitter electrode 13b of the first semiconductor chip 13 is connected to the heat sink 16 through the solder 33, and the source electrode 14b of the second semiconductor chip 14 is connected to the same heat sink 16 through the solder 34. The recess 15c is formed at the surface 15a of the heat sink 15 to include the drain electrode 14a, and the recess 16c is formed at the surface 16a of the heat sink 16 to include the source electrode 14b.

In the first modification, the drain electrode 14a and the source electrode 14b correspond to the second electrode, and the solders 25 and 34 correspond to the second solder. The thickness of the solder 25 is greater than the maximum thickness of the solder 24 at the entirety of the drain electrode 14a. The thickness of the solder 34 is greater than the maximum thickness of the solder 33 at the entirety of the source electrode 14b. Accordingly, in the semiconductor device 10 having the radiation structure at both surfaces, the above described connection structure is achieved. The structure described in the above first to seventh embodiments may be adapted to the semiconductor device 10 having the radiation structure at both sides.

Figure 19:
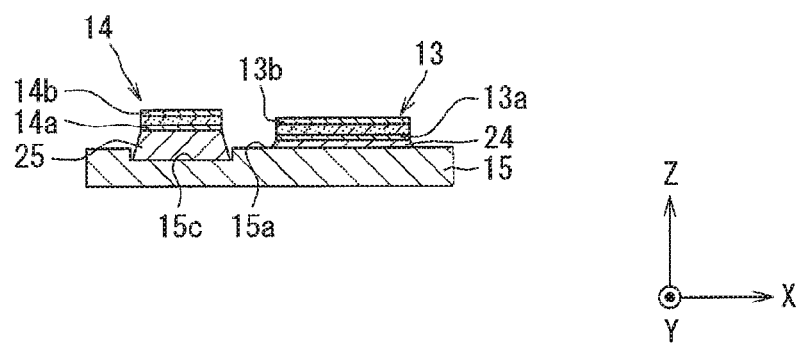
FIG. 19 is a cross sectional view for illustrating a second modification.

The example is described in which the semiconductor device 10 includes the heat sinks 15 and 16 at the both sides of the semiconductor chips 13 and 14. However, the present disclosure may be adapted to a semiconductor device having radiation structure at the single side in which the heat sink is disposed at one side of the semiconductor chips 13 and 14. In the second modification shown in FIG. 19, the semiconductor device 10 includes the first semiconductor chip 13 and the second semiconductor chip 14 and the heat sink 15. The collector electrode 13a of the first semiconductor chip 13 is connected to the heat sink 15 through the solder 24, and the drain electrode 14a of the second semiconductor chip 14 is connected to the same heat sink 15 through the solder 25. The recess 15c is formed at the surface 15a of the heat sink 15 so as to include the drain electrode 14a. The thickness of the solder 25 is greater than the maximum thickness of the solder 24 at the entirety of the drain electrode 14a. The structure described in the above first to seventh embodiments may be adapted to the semiconductor device 10 having the radiation structure at single side.

The example is described in which the heat sink 15 corresponds to the metal member and the first semiconductor chip 13 and the second semiconductor chip 14 have the electrodes 13a, 13b, 14a and 14b at the both sides. However, the metal member is not limited to the heat sink 15. The first semiconductor chip only have to include the first metal layer at the surface facing the metal member, and the second semiconductor chip include the second metal layer at the surface facing the metal member. That is, the first metal layer and the second metal layer are not limited to the electrodes. The first metal layer and the second metal layer may be metal layers for radiating heat. In the structure in which the metal member and the first metal layer are connected by the first solder and the metal member and the second metal layer are connected by the second solder, the thickness of the second solder is greater than the maximum thickness of the first solder at least at the portion of the second solder corresponding to the part of the outer peripheral edge of the second metal layer.

Although the example is described in which the first semiconductor chip 13 is formed of Si and the second semiconductor chip 14 is formed of SiC, the present disclosure is not limited to the example. The second semiconductor chip 14 is formed of a semiconductor material having larger Young's modulus than the first semiconductor chip 13.

The invention claimed is:

1. A semiconductor device comprising:
a metal member;
a first semiconductor chip that is disposed on a surface of the metal member and has a first metal layer at a surface facing the metal member;
a second semiconductor chip that is formed of a material having larger Young's modulus than the first semiconductor chip and is disposed at a position different from the first semiconductor chip on the surface of the metal member, the second semiconductor chip having a second metal layer at a surface facing the metal member;
a first solder that is disposed between the metal member and the first metal layer of the first semiconductor chip and connects the metal member and the first metal layer; and
a second solder that is disposed between the metal member and the second metal layer of the second semiconductor chip and connects the metal member and the second metal layer, wherein
a quantity of heat generated in the first semiconductor chip is greater than a quantity of heat generated in the second semiconductor chip, and
a thickness of the second solder is greater than a maximum thickness of the first solder at least at a portion of the second solder corresponding to a part of an outer peripheral edge of the second metal layer.

2. The semiconductor device according to claim 1, wherein
the thickness of the second solder is greater than the maximum thickness of the first solder at an entirety of the second metal layer.

3. The semiconductor device according to claim 1, wherein
the thickness of the second solder is greater than the maximum thickness of the first solder at an entire periphery of the outer peripheral edge of the second metal layer.

4. The semiconductor device according to claim 1, wherein
a planar shape of the second metal layer is a polygonal shape, and
the thickness of the second solder is greater than the maximum thickness of the first solder at a corner of the second metal layer.

5. The semiconductor device according to claim 1, wherein
the metal member has a recess that is formed at the surface of the metal member correspondingly to the second metal layer, and
the recess causes the thickness of the second solder being greater than the maximum thickness of the first solder.

6. The semiconductor device according to claim 5, wherein
at least a part of the second solder is disposed in the recess.

7. The semiconductor device according to claim 2, wherein
the metal member has a first protrusion that is formed at the surface of the metal member,
the first protrusion includes the first metal layer in a projection view in a direction orthogonal to the surface of the metal member, and
the first protrusion causes the thickness of the second solder being greater than the maximum thickness of the first solder at the entirety of the second metal layer.

8. The semiconductor device according to claim 7, wherein
the first solder is disposed on the first protrusion.

9. The semiconductor device according to claim 3, wherein
the metal member has a first protrusion that is formed at the surface of the metal member,
the first protrusion includes the first metal layer in a projection view in a direction orthogonal to the surface of the metal member,
the metal member has a second protrusion that is formed at the surface of the metal member,
the second protrusion has a planar shape homothetic to the second metal layer,
the second protrusion is included within the second metal layer in the projection view in the direction orthogonal to the surface of the metal member, and
the first protrusion and the second protrusion causes the thickness of the second solder being greater than the maximum thickness of the first solder at the entire periphery of the outer peripheral edge of the second metal layer.

10. The semiconductor device according to claim 9, wherein
the first solder is disposed on the first protrusion,
a portion of the second solder corresponding to the entire periphery of the outer peripheral edge of the second metal layer is disposed on the metal member, and
a portion of the second solder excepting the portion of the second solder corresponding to the entire periphery of the outer peripheral edge of the second metal layer is disposed on the second protrusion.

11. The semiconductor device according to claim 4, wherein
the metal member has a first protrusion that is formed at the surface of the metal member,
the first protrusion includes the first metal layer in a projection view in a direction orthogonal to the surface of the metal member,
the metal member has a third protrusion that is formed at the surface of the metal member,
the third protrusion is overlapped with a portion of the second metal layer excepting the corner of the second metal layer in the projection view in the direction orthogonal to the surface of the metal member, and
the first protrusion and the third protrusion cause the thickness of the second solder being greater than the maximum thickness of the first solder at the corner of the second metal layer.

12. The semiconductor device according to claim 11, wherein
the first solder is disposed on the first protrusion,
a portion of the second solder corresponding to the corner of the second metal layer is disposed on the metal member, and
a portion of the second solder excepting the portion of the second solder corresponding to the corner of the second metal layer is disposed on the third protrusion.

13. The semiconductor device according to claim 1, wherein
the metal member has a suppression that is formed at the surface of the metal member and suppresses the second solder from spreading, and the suppression causes the thickness of the second solder being greater than the maximum thickness of the first solder.

14. The semiconductor device according to claim 13, wherein
the second solder is dammed up by the suppression.

15. The semiconductor device according to claim 1, wherein
the first metal layer of the first semiconductor chip is electrically connected to the metal member through the first solder,
the second metal layer of the second semiconductor chip is electrically connected to the metal member through the second solder, and
the semiconductor device further comprising:
a heat sink that has the first semiconductor chip and the second semiconductor chip between the surface of the metal member;
a first terminal that is disposed between the heat sink and the first semiconductor chip and electrically connects the first semiconductor chip and the heat sink; and
a second terminal that is disposed between the heat sink and the second semiconductor chip and electrically connects the second semiconductor chip and the heat sink.

16. The semiconductor device according to claim 2, wherein
the first metal layer of the first semiconductor chip is electrically connected to the metal member through the first solder,
the second metal layer of the second semiconductor chip is electrically connected to the metal member through the second solder, and
the semiconductor device further comprising:
a heat sink that has the first semiconductor chip and the second semiconductor chip between the surface of the metal member;
a first terminal that is disposed between the heat sink and the first semiconductor chip and electrically connects the first semiconductor chip and the heat sink; and
a second terminal that is disposed between the heat sink and the second semiconductor chip and electrically connects the second semiconductor chip and the heat sink, and wherein
a thickness of the second terminal is less than a thickness of the first terminal and the thickness of the second solder is greater than the maximum thickness of the first solder at the entirety of the second metal layer.

17. The semiconductor device according to claim 1, wherein
the first semiconductor chip is formed of silicon, and
the second semiconductor chip is formed of silicon carbide.

* * * * *